(12) United States Patent
Freitag et al.

(10) Patent No.: US 10,306,775 B2
(45) Date of Patent: May 28, 2019

(54) METHOD OF FORMING AN ELECTRICAL INTERCONNECT

(71) Applicant: XEROX CORPORATION, Norwalk, CT (US)

(72) Inventors: Chad David Freitag, West Linn, OR (US); Tygh James Newton, Sherwood, OR (US); Chad Johan Slenes, Sherwood, OR (US)

(73) Assignee: XEROX CORPORATION, Norwalk, CT (US)

( * ) Notice: Subject to any disclaimer, the term of this patent is extended or adjusted under 35 U.S.C. 154(b) by 173 days.

(21) Appl. No.: 15/409,807

(22) Filed: Jan. 19, 2017

(65) Prior Publication Data

US 2017/0135228 A1    May 11, 2017

Related U.S. Application Data

(62) Division of application No. 13/352,215, filed on Jan. 17, 2012, now Pat. No. 9,572,254.

(51) Int. Cl.
*H05K 3/40* (2006.01)
*H05K 1/11* (2006.01)
*H05K 3/36* (2006.01)
*H05K 3/32* (2006.01)

(52) U.S. Cl.
CPC ............ *H05K 3/4007* (2013.01); *H05K 1/11* (2013.01); *H05K 1/111* (2013.01); *H05K 1/112* (2013.01); *H01L 2924/01078* (2013.01); *H01L 2924/01079* (2013.01); *H05K 3/321* (2013.01); *H05K 3/361* (2013.01); *H05K 3/363* (2013.01); *H05K 2201/0394* (2013.01); *H05K 2201/0969* (2013.01); *H05K 2201/09681* (2013.01)

(58) Field of Classification Search
CPC .......... H05K 1/05; H05K 1/053; H05K 1/056; H05K 3/44; H05K 1/11; H05K 1/111; H05K 1/112; H05K 3/321; H05K 3/361; H05K 3/363; H05K 3/4007; H05K 2201/0394; H05K 2201/09681; H05K 2201/0969
See application file for complete search history.

(56) References Cited

U.S. PATENT DOCUMENTS

| 4,021,267 | A | 5/1977 | Dettling |
| 4,235,221 | A | 11/1980 | Murphy |
| 4,726,044 | A | 2/1988 | Perna et al. |
| 5,261,157 | A | 11/1993 | Chang |
| 5,489,555 | A | 2/1996 | Yamazaki |
| 5,620,528 | A | 4/1997 | Schade et al. |
| 5,872,399 | A | 2/1999 | Lee |
| 6,248,948 | B1 | 6/2001 | Nakagawa et al. |

(Continued)

FOREIGN PATENT DOCUMENTS

EP     521720 A1 *  1/1993
JP  20022170916 A *  6/2002

*Primary Examiner* — Carl J Arbes
(74) *Attorney, Agent, or Firm* — Miller Nash Graham & Dunn LLP

(57) ABSTRACT

A method of forming an electrical interconnect includes etching a lattice pattern into a contact pad on a circuit substrate as a first connection point, at least partially filling the lattice pattern with a conductive epoxy, contacting the conductive epoxy with a second connection point, and curing the epoxy.

17 Claims, 3 Drawing Sheets

(56) References Cited

U.S. PATENT DOCUMENTS

| | | |
|---|---|---|
| 6,350,944 B1 | 2/2002 | Sheirf et al. |
| 6,573,610 B1 | 6/2003 | Tsai |
| 6,580,035 B1 | 6/2003 | Chung |
| 7,044,746 B2 | 5/2006 | Copper et al. |
| 7,419,378 B2 | 9/2008 | Ha et al. |
| 7,642,449 B2 | 1/2010 | Korman et al. |
| 7,973,551 B2 | 7/2011 | Jiang |
| 8,333,597 B2 | 12/2012 | Tamura |
| 2002/0029902 A1 | 3/2002 | DiStefano et al. |
| 2002/0039847 A1 | 4/2002 | Clayton |
| 2005/0056312 A1 | 3/2005 | Young et al. |
| 2006/0042680 A1 | 3/2006 | Korman et al. |
| 2006/0237855 A1 | 10/2006 | Kroehnert et al. |
| 2007/0072313 A1 | 3/2007 | Yamada |
| 2007/0134947 A1 | 6/2007 | Neidlein |
| 2007/0272437 A1 | 11/2007 | Kondo |
| 2008/0314434 A1 | 12/2008 | Khouri et al. |
| 2009/0014057 A1 | 1/2009 | Croft et al. |
| 2009/0101192 A1 | 4/2009 | Kothari et al. |
| 2011/0073355 A1 | 3/2011 | Tamura |
| 2011/0151687 A1 | 6/2011 | Mulfinger et al. |
| 2011/0165719 A1 | 7/2011 | Solzbacher et al. |
| 2011/0232952 A1 | 9/2011 | Cooney et al. |
| 2012/0217614 A1 | 8/2012 | Burgyan et al. |
| 2012/0257366 A1 | 10/2012 | Mason et al. |
| 2013/0260578 A1 | 10/2013 | Mason et al. |

\* cited by examiner

METHOD OF FORMING AN ELECTRICAL INTERCONNECT

CROSS REFERENCE TO RELATED APPLICATION

This is a divisional application of U.S. patent application Ser. No. 13/352,215, filed Jan. 17, 2012, which is incorporated herein by reference in its entirety.

TECHNICAL FIELD

This disclosure relates to electrical interconnects, more particularly to electrical interconnects using conductive epoxy.

BACKGROUND

Conductive epoxy provides many advantages in bonding different layers of an electrical apparatus. For example, print or other liquid dispensing techniques can dispense the epoxy, allowing for larger scale or quicker preparation in bonding two structures together, while creating electrical connections. Many epoxies retain some elasticity after curing, offering advantages for flexible circuit substrates.

Flexible interconnects often take the form of metalized pads serving as a bond point for the conductive epoxy. These pads are flat metal areas on each of the surfaces undergoing bonding. The amount of conductive epoxy used often represents a failure point in creating a robust electrical connection. If too little epoxy is used, the connection tends to fail during thermal cycling. The epoxy typically separates from one or the other surface to which it is attempting to bond. If too much epoxy is used, the epoxy squeezes out beyond the intended conductive surfaces and may cause electrical shorts to other conductive surfaces.

SUMMARY

An embodiment is a method of forming an electrical interconnect that includes etching a lattice pattern into a contact pad on a circuit substrate as a first connection point, attaching a coverlay to the circuit substrate such that that connection point resides at least partially in the coverlay material, at least partially filling the lattice pattern with a conductive epoxy, contacting the conductive epoxy with a second connection point, and curing the epoxy.

Another embodiment is a method of forming an electrical interconnect that includes etching a lattice pattern into a contact pad on a circuit substrate as a first connection point, at least partially filling the lattice pattern with a conductive epoxy, contacting the conductive epoxy with a second connection point, and curing the epoxy.

DETAILED DESCRIPTION OF THE EMBODIMENTS

Figure 1:
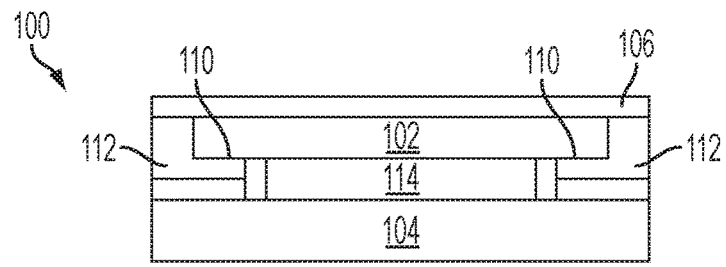
FIG. 1 shows a side view of a prior art electrical interconnect configuration.

FIG. 1 shows a prior art electrical interconnect 100 in a thermally stressed circuit that has a surface bond between two electrical connection points 102, 104. The first electrical connection point 102 is secured to a circuit substrate 106. Anchor points 110 of the first electrical connection point 102 reside in a coverlay 112. An adhesive layer adheres the coverlay 112 to the second electrical connection point 104. The surface bond of this prior art electrical interconnect 100 is a two-dimensional layer of conductive epoxy 114 sandwiched between the first electrical connection point 102 and the second electrical connection point 104. This two-dimensional structure requires a critical amount of conductive epoxy 114 to create a robust electrical connection between the two electrical connection points 102, 104. Applying too little epoxy causes the electrical interconnect to fail during thermal cycling and sometimes separation occurs between the electrical connection points as a result. If too much epoxy is applied, electrical shorts occur in nearby connections. Finding the balance between too little and too much epoxy is challenging, especially as the demand for increased interconnect density rises.

Figure 2:
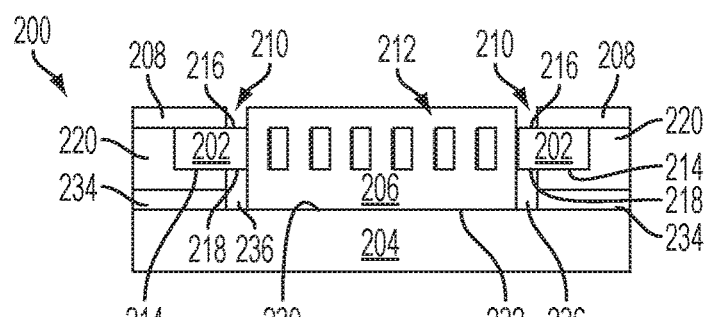
FIG. 2 shows a side view of a suspended lattice electrical interconnect.

FIG. 2 shows an electrical interconnect 200 that has a suspended lattice bond between two electrical connection points 202, 204. In this example, the suspended lattice bond includes a lattice pattern that creates a three-dimensional bond between the two electrical connection points 202, 204, rather than a two-dimensional bond as shown in FIG. 1 describing the prior art. The three-dimensional suspended lattice-pattern bond allows for a greater volume of conductive epoxy to be applied between the electrical connection points 202, 204, which increases the robustness of the connection during thermal cycling. Further, the three-dimensional configuration decreases the precision necessary for determining the amount of conductive epoxy 206 that is required to strike the critical balance between too little and too much conductive epoxy 206 for the electrical interconnect and overall increases the thermal reliability of the electrical interconnect. Some common conductive epoxies include carbon-tube impregnated epoxy and silver epoxy, although the suspended lattice bond interconnect increases the reliability of any electrically-conductive bonded material.

FIG. 2 shows a circuit substrate 208 having an electrical connection point 202 on it. The circuit substrate 208 includes a gap 210 (cf. the solid circuit substrate shown in the prior art example shown FIG. 1). The electrical connection point 202 has a lattice 212 of conductive material that is adjacent to or otherwise positioned within at least a portion of the gap 210. The lattice 212 is attached to the circuit substrate 208 by anchor points 214 in the example shown in FIG. 2. In this example, the electrical connection point 202, and thus the lattice 212, is round and may have any suitable number of anchor points 214 along its perimeter.

Figure 3:
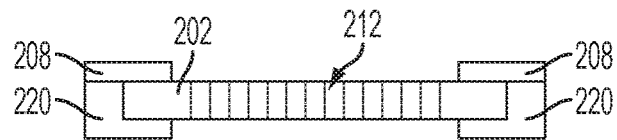
FIG. 3 shows a cross-sectional view of a portion of the suspended lattice electrical interconnect shown in FIG. 2.

The conductive epoxy 206 encapsulates the lattice 212 and extends through portions of the lattice 212 in some examples, as shown in the cross-sectional view of FIG. 3. This configuration forms a three-dimensional bond between the electrical connection points, although the second electrical connection point 204 is not shown in FIG. 3. Referring back to FIG. 2, the height of the conductive epoxy 206 may exceed the height of the electrical connection point 202. FIG. 2 shows the conductive epoxy 206 extending along a majority of a top surface 216 and an opposing, bottom surface 218 of the electrical connection point 202, encapsulating the lattice 212 of conductive material, which increases the surface area of the connection between the conductive epoxy 206 and the electrical connection point 202 from the prior art surface bond configuration shown in FIG. 1.

Figure 4:
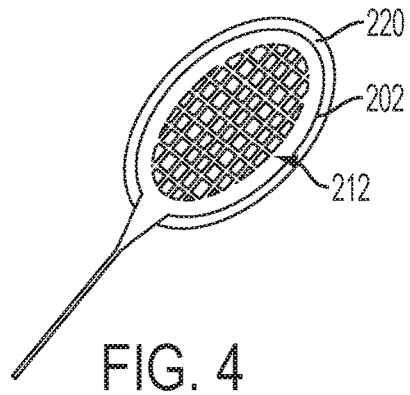
FIG. 4 shows a top view of an example lattice pattern in the electrical connection point of the electrical interconnect shown in FIG. 2.
Figure 5A:
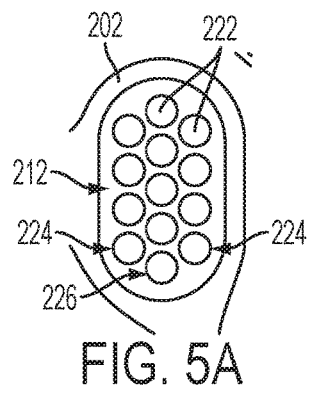
FIGS. 5A-5G show additional example lattice patterns.
Figure 5B:
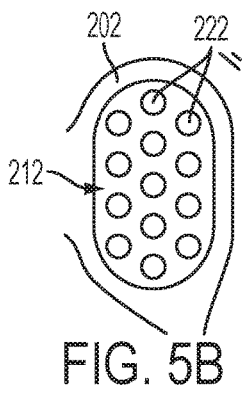
Figure 5C:
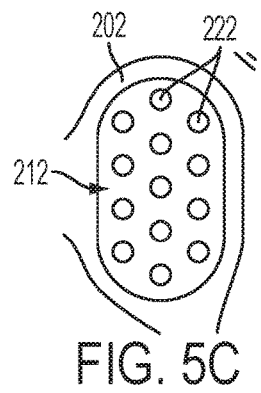
Figure 5D:
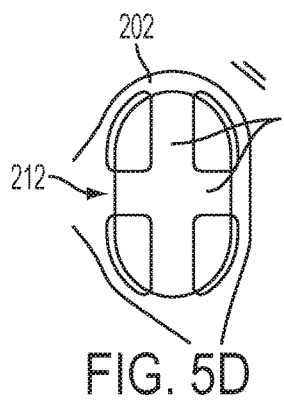
Figure 5E:
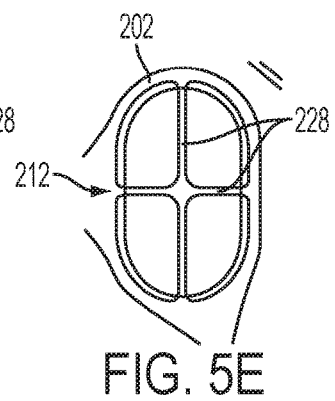
Figure 5F:
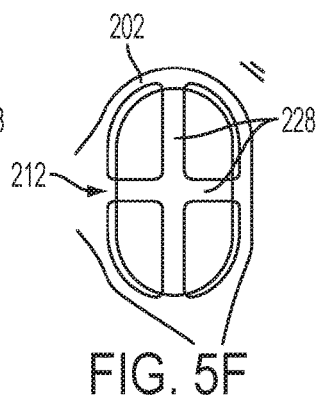
Figure 5G:
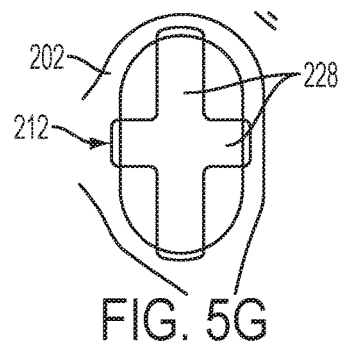

FIG. 4 shows a top view of the electrical connection point 202 with a criss-cross patterned lattice 212 that defines multiple rectangular-shaped openings into which the conductive epoxy 206 is placed. The electrical connection point 202 is oval-shaped in this example, although it can be any suitable shape in alternative configurations. A coverlay material 220 extends along the perimeter of the electrical connection point 202 in this example.

FIGS. 5A-5G show alternative lattice 212 patterns for the electrical connection point 202. The lattice 212 patterns in FIGS. 5A-5C include multiple round openings 222 in various configurations. More specifically, FIGS. 5A-5C include multiple circular-shaped openings 222, spaced apart from one another and arranged in 3 columns in which the two, aligned outer columns 224 have four circular openings while the middle column 226 has five circular openings that are offset from the openings in the two outer columns 224. The radius of the circular openings 222 is uniform within each example lattice pattern, although these circular openings 222 vary in radius size in each of the illustrated examples shown I FIGS. 5A-5C. The lattice 212 patterns in FIGS. 5D-5G include two linear portions 228 that intersect each other at an approximately 90° angle and define four quadrant openings. The width of each of the intersecting linear portions 228 is approximately equal within each of the specific example lattice patterns, although the width varies in each of the examples shown in FIGS. 5D-5G.

Referring again to FIG. 2, the example electrical interconnect also includes a second electrical connection point 204 that is adjacent to the electrical connection point 202 that is on the surface of the circuit substrate 208. The second electrical connection point 204 contacts the conductive epoxy 206 in any suitable manner, although FIG. 2 shows that a top surface 230 of the second electrical connection point 204 is in contact with a bottom surface 232 of the conductive epoxy 206.

A coverlay material 220 is in contact with the circuit substrate 208 and may be positioned as a layer between the circuit substrate 208 and the second electrical connection point 204, as shown in FIG. 2. The anchor points 214 of the lattice 212 may reside in the coverlay material 220 and may restrict the conductive epoxy 206 to the lattice 212 of conductive material. An adhesive 234 may adhere the coverlay material 220 to the second electrical connection point 204 in some examples, such as the electrical interconnect 200 shown in FIG. 2.

The gap 210 in the circuit substrate 208 is approximately equal in width to a gap 236 in the coverlay 220 and adhesive layer 234. The gaps 210, 236 form a continuous column between the circuit substrate 208, the coverlay 220, and the adhesive layer 234 with the electrical connection point 202 extending therebetween. The conductive epoxy 206 extends from the top surface of the second electrical connection point 204 to a height approximately extending to the top surface of the circuit substrate 208. Because the conductive epoxy 206 extends through the lattice 212, the electrical interconnect 200 can withstand greater thermal cycling without damage or separation occurring between the electrical connection points 202, 204 and the conductive epoxy 206.

Figure 6:
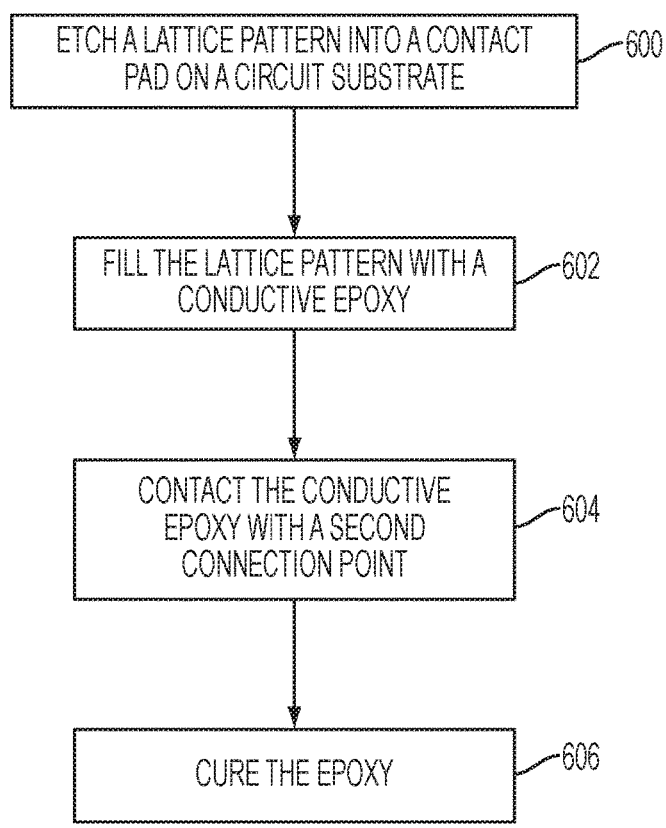
FIG. 6 describes a method of forming an electrical interconnect.

The electrical interconnects described above can be made in many different manners. FIG. 6 shows the steps of one example method of forming an electrical interconnect. A lattice pattern is etched into a contact pad on a circuit substrate 600. The lattice pattern is then filled with a conductive epoxy 602 and a second connection point is then contacted with the conductive epoxy to interconnect the contact pad and the second connection point 604. The epoxy is then cured 606 in any suitable fashion. As described above, the circuit substrate may include a gap and the lattice pattern that is etched into the contact pad may be positioned adjacent the gap in the circuit substrate. The conductive epoxy encapsulates the lattice pattern, as described above with reference to FIG. 2. The lattice pattern includes any suitable pattern, such as one or more round or linear openings. A coverlay material may be applied to the circuit substrate such that a portion of the contact pad resides in the coverlay material.

It will be appreciated that several of the above-disclosed and other features and functions, or alternatives thereof, may be desirably combined into many other different systems or applications. That various presently unforeseen or unanticipated alternatives, modifications, variations, or improvements therein may be subsequently made by those skilled in the art which also are intended to be encompassed by the following claims.

What is claimed is:

1. A method of forming an electrical interconnect, comprising:
   etching a three-dimensional lattice pattern into a contact pad on a circuit substrate as a first connection point;
   at least partially filling the lattice pattern with a conductive epoxy;
   contacting the conductive epoxy with a second connection point to form a three-dimensional electrical connection between the contact pad as a first connection point and the second connection point; and
   curing the epoxy.

2. The method of claim 1, wherein the lattice pattern is etched into the contact pad adjacent a gap in the circuit substrate.

3. The method of claim 1, wherein the conductive epoxy encapsulates the lattice pattern.

4. The method of claim 1, wherein the lattice includes at least one round opening.

5. The method of claim 1, wherein the lattice includes two intersecting linear portion defining four quadrant openings.

6. The method of claim 1, further comprising applying a coverlay material to the circuit substrate such that a portion of the contact pad resides under the coverlay material and resides between the first and second connection points separate from the conductive epoxy.

7. The method of claim 6, wherein at least partially filling the lattice pattern with the conductive epoxy comprising filling the lattice pattern with the epoxy such that a height of the epoxy exceeds a height of the first connection point.

8. The method of claim 1, wherein the lattice pattern comprises an array of circular openings.

9. The method of claim 8, wherein each of the circular openings have a same radius.

10. The method of claim 1, wherein the conductive epoxy comprises one of silver epoxy or carbon-tube impregnated epoxy.

11. A method of forming an electrical interconnect, comprising:
   etching a three-dimensional lattice pattern into a contact pad on a circuit substrate as a first connection point;
   attaching a coverlay to the circuit substrate such that that first connection point resides at least partially under the coverlay material;
   at least partially filling the lattice pattern with a conductive epoxy;
   contacting the conductive epoxy with a second connection point to form a three-dimensional electrical connection between the contact pad as a first connection point and the second connection point;
   curing the epoxy.

12. The method of claim 11, wherein the lattice pattern is etched into the contact pad adjacent a gap in the circuit substrate.

13. The method of claim 11, wherein the conductive epoxy encapsulates the lattice pattern.

14. The method of claim 11, wherein the lattice includes at least one round opening.

15. The method of claim 11, wherein the lattice includes two intersecting linear portion defining four quadrant openings.

16. The method of claim 11, wherein at least partially filling the lattice pattern with the conductive epoxy comprising filling the lattice pattern with the epoxy such that a height of the epoxy exceeds a height of the first connection point.

17. The method of claim 11, wherein the conductive epoxy comprises one of silver epoxy or carbon-tube impregnated epoxy.

\* \* \* \* \*